United States Patent
Schlosser et al.

[19]

[11] Patent Number: 6,096,968
[45] Date of Patent: Aug. 1, 2000

[54] SOLAR CELL WITH A BACK-SURFACE FIELD

[75] Inventors: Reinhold Schlosser, Munich; Adolf Münzer, Unterschleissheim, both of Germany

[73] Assignee: Siemens Solar GmbH, Munich, Germany

[21] Appl. No.: 09/212,804

[22] Filed: Dec. 16, 1998

Related U.S. Application Data

[62] Division of application No. 08/913,097, filed as application No. PCT/DE96/00415, Mar. 7, 1996, Pat. No. 5,899,704.

[30] Foreign Application Priority Data

Mar. 10, 1995 [DE] Germany ............ 195 08 712

[51] Int. Cl.$^7$ ............ H01L 31/18; H01L 31/068; H01L 31/0288
[52] U.S. Cl. ............ 136/256; 136/255; 136/249; 136/252; 136/244; 257/461; 257/464; 257/437
[58] Field of Search .................... 136/256, 255, 136/249 MS, 252, 244; 257/461, 464, 437

[56] References Cited

U.S. PATENT DOCUMENTS

| | | | |
|---|---|---|---|
| 4,158,591 | 6/1979 | Avery et al. | 438/98 |
| 4,577,393 | 3/1986 | Schmidt | 438/72 |
| 5,899,704 | 5/1999 | Schlosser et al. | 438/98 |

FOREIGN PATENT DOCUMENTS

| | | |
|---|---|---|
| 33 40 874 C2 | 5/1985 | Germany . |
| WO 91/19323 | 12/1991 | WIPO . |

OTHER PUBLICATIONS

14$^{TH}$ IEEE Photovoltaic Specialists Conference, Jan. (1980), R.E. Thomas et al, Solid Source Diffusion Process for Silicon Solar Cells, pp. 811–814.
17$^{TH}$ IEEE Photovoltaic Specialitsts Conference, May (1984), M. Gillanders et al, Low Alpha, Boron BSF Solar Cell, pp. 138–143.
11$^{TH}$ EC Photovoltaic Solar Energy Conference, Oct. (1992), J. Nijs et al, Towards 16% Efficient Polycrystalline Silicon Solar Cells, Using A Relatively Simple Technology, pp. 164–167.
Solar Cells, vol. 17, No. 1, Mar. (1986), A. Rohatgi et al, High–Efficiency Silicon Solar Cells: Development, Current Issues and Future Directions, pp. 119–133.
Journal of the Electrochemical Society, vol. 134, No. 12, Dec. (1987), R.B. Campbell et al, The Fabrication and Analysis of Bifacial Solar Cells From Dendritic Web Silicon Substrates, pp. 3160–3164.
From the catalogue Merck Electronic Chemical, Process Chemicals, pp. 4–14. (Date Unknown).

*Primary Examiner*—Alan Diamond
*Attorney, Agent, or Firm*—Hill & Simpson

[57] ABSTRACT

For the simple production of a back surface field it is proposed that a boron-containing diffusion source layer (2) be applied to the rear (RS) of a silicon wafer (1) and boron be driven into the wafer to a depth of about 1 to 5 μm at 900 to 1200° C. This is done in an oxygen-containing atmosphere so that an oxide layer (4) is formed on open silicon surfaces, obviating the need to mask the regions not to be doped. After the removal of the oxide and source layer, phosphorus diffusion takes place and the back contact (3) is produced. It contains aluminum and, during the burn-in process, provides good ohmic contact.

3 Claims, 2 Drawing Sheets

SOLAR CELL WITH A BACK-SURFACE FIELD

This is a Divisional of application Ser. No. 08/913,097, filed Sep. 8, 1997, now U.S. Pat. No. 5,899,704, which is a 371 of PCT/DE96/00415 filed Mar. 7, 1996.

BACKGROUND OF THE INVENTION

When attempting to reduce the thickness of silicon solar cells, a decreasing efficiency of the solar cell is observed. This is due, on the one hand, to the no longer complete absorption of sunlight when there is a thinner absorption length. On the other hand, charge carriers are increasingly generated in proximity to the back, with minority charge carriers being able to reach the back electrode as a result of diffusion, thereby reducing the current generated by the majority charge carriers.

A highly doped layer on the back makes it possible to generate a field that counteracts the diffusion of minority charge carriers, a so-called back-surface field. In the case of a solar cell structure having a p-doped solar cell body and an n+ doped emitter on the solar cell's light-incidence or front side, a p+ doping is necessary on the back for this purpose. Aluminum, which is applied as a thin layer for example by vapor deposition on the back and which can be driven in or alloyed by means of an annealing step, is very often suggested in order to generate this p+ doping. It is also possible to generate the p+ doping by applying back contacts that contain aluminum and by correspondingly driving in the aluminum. It is further possible to diffuse aluminum from a solid diffusion source into the solar cell substrate. This nevertheless suffers from the drawback that the solar cell substrate is doped with aluminum on both sides, thus generating a p+pp+ structure.

Boron is also suitable for p-doping generation. A corresponding back-surface field can be generated by gaseous diffusion of a correspondingly volatile or gaseous boron compound, by applying a silicon layer that contains boron on the back or by applying a liquid solution that contains a dopant. Due to the high volatility of the boron compounds, however, an all-over diffusion which has to be prevented by masking those solar cell regions that are not to be doped is constantly observed at the temperatures necessary for driving in the doping.

The p+ doping—which is simple to produce according to the process—with aluminum suffers from the disadvantage of an increased susceptibility to corrosion. Over time, layer regions that contain aluminum may decompose and peel off, which may result in damage to the back contacts and cause a reduction in solar cell performance.

A method of producing a silicon solar cell is known from IEEE PHOTOVOLTAIC SOLAR ENERGY CONFERENCE, Oct. 12–16, 1992, Montreux, Switzerland, pages 164–167; in this method, a boron-doped oxide layer is applied on the back of a silicon wafer and then the boron is diffused into the silicon at a temperature of 940° C. An emitter layer is subsequently generated by means of phosphorus diffusion before contacts are applied by etching.

A method of producing a silicon solar cell which is particularly directed at the production of doped regions is known from PCT reference WO 91/19323. An oxide-forming mask layer containing a dopant is applied to part of the surface of a semiconductor substrate, and the substrate is then heated to a temperature sufficient for the diffusion of part of the dopant from the mask layer into the semiconductor layer, with the bare semiconductor substrate surface also being autodoped. The semiconductor substrate's autodoped regions are etched off, while the mask layer represents a protective layer for the doped regions beneath the mask layer.

SUMMARY OF THE INVENTION

The problem facing the present invention is to indicate a method of producing a back-surface field in a silicon solar cell; such a method can be integrated without considerable outlay into a conventional solar cell production process that is simple and reliable to implement and which results in a solar cell that is stable over the long term and exhibits reduced susceptibility to corrosion. The method is intended to make it possible to economize on silicon material by means of thinner solar cells while nevertheless achieving higher solar cell efficiency.

In general terms the present invention is a method of generating a solar cell with a back-surface field. In a step (a) a diffusion source layer that contains boron as a dopant is applied on the back of a p-doped silicon wafer. In a step (b) the wafer is treated in an atmosphere that contains oxygen at a temperature of 900° C. to 1200° C. to generate an oxide layer and to drive in the dopant. In a step (c) the diffusion source layer and the oxide layer are removed. There is in a step (d) an all-over diffusion of phosphorus to generate an n+ doped emitter layer. In a step (e) the n+ doped layer is separated at the edge of the wafer. A contact that contains aluminum is applied in a step (f) and in a step (g) is burned in. In a step (h) a front side contact is produced.

Advantageous developments of the present invention are as follows.

A boron doping resist layer is applied in a step (a) as a diffusion source layer.

The wafer is exposed to a temperature of 1000° C. to 1100° C. in step (b).

The diffusion source layer and the oxide layer are removed by etching using HF solution in step (c).

The wafers are densely stacked above or next to one another in step (e) and the separation of the p+ doped layer takes place by etching off the outer edges of the wafers.

A back contact is applied by imprinting a silver screen printing paste.

A back contact which contains 1 to 3 percent by weight aluminum is applied in step (f).

The boron is driven to a depth of 1 $\mu$m to 5 $\mu$m in step (b).

The present invention is also a solar cell having a p-doped solar cell body, a layer region p+ doped with boron with a depth of 1 $\mu$m to 5 $\mu$m on the back, an n+ doped layer region at least on the front side, a front side contact, a burned-in silver back contact that contains aluminum, and an aluminum-doped connection region in the region of the back contact.

In a further development of the solar cell the back contact is not holohedrally applied. The boron doping is overcompensated by a flatter n+ doping between those regions of the back covered by the back contact.

In another development of the solar cell, the solar cell has an anti-reflective layer on the front and an oxide layer as a passivating layer on the back.

The invention's basic idea is to generate the back-surface field's p+ doping by driving boron out of a boron-containing diffusion source layer. The undesirable doping of the wafer's edges and front side is prevented in that the driving out operation is performed at high temperatures of 900 to 1200°

C. in an atmosphere that contains oxygen. Under these conditions, an oxide layer is immediately formed at the wafer's edges and front side; this layer serves the function of masking, thereby preventing undesirable doping at these sites. After driving in, both the oxide and the diffusion source layer can be removed as a result of a simple etching step.

The back-surface field (BSF) is therefore generated before the semiconductor junction is produced, i.e. before the diffusion of phosphorus on the front side of the solar cell. The selected high temperatures ensure that the boron doping is driven in deeply. This latter is then likewise stable with respect to all of the solar cell's following production steps which are carried out at much lower temperatures.

A further advantage of the invention is obtained when producing the junction by means of diffusion of phosphorus, which may take place all over, i.e. on both sides and at the edges of the wafer. With regard to phosphorus diffusion, it is therefore necessary neither to mask nor to cover layer regions in order to rule out undesirable doping in specific regions. The deeply driven in BSF doping is only superficially overcompensated by the phosphorus.

By using the back contact's aluminum-containing material, it is in turn possible to contact through to the p+ layer when burning in the back contact and to recompensate the n+ layer in the back contact region. The back contact can be applied in a structured or holohedral manner.

The diffusion source layer is one that contains boron and out of which the boron is thermally driven. The diffusion source layer is preferably applied by means of a boron doping resist. In addition to boron or its compounds, this resist contains powdery $SiO_2$ in a suspension. This doping resist is normally used for generating high dopings in power semiconductors. It may be applied in liquid form and may for example be spun on.

The back of the solar cell is preferably hydrophobic and hence oxide-free. The doping resist is applied to this surface in as thin a layer as possible and dried, thus preventing the diffusion source layer from forming cracks or even flaking off during the driving-in process. The back is homogeneously doped with a homogeneous and undamaged diffusion source layer.

The boron from the diffusion source layer is driven into the solar cell at 900 to 1200° C., preferably at 1000 to 1100° C. This range is below the 1280° C. suggested by the doping resist manufacturer for application purposes. The driving-in temperature is nevertheless higher than was previously the case with solar cells.

As regards the application of boron doping resist, its manufacturer had previously suggested coating one side of the components or wafers with the resist and placing them on top of each other in a stack such that surfaces respectively to be doped or not to be doped end up on top of one another. In this way, doping of the respectively opposite surface is intended to be prevented without necessitating masking. This proposed method does, however, have the drawback that the components or wafers agglomerate at the high requisite drive-in temperatures and must then be mechanically or chemically separated from one another.

In the method according to the invention, those regions that are not to be doped need neither be masked nor covered by stacking. When the doping is driven in, the solar cells (wafers) are spaced apart so that no agglomeration can occur.

When the doping is driven in, the atmosphere has to contain oxygen. The process is preferably carried out in a pure oxygen atmosphere. In order that the oxide layer can be immediately formed, the solar cells are directly introduced into a furnace preheated to the drive-in temperature. After the oxide's rapid formation, the oxygen atmosphere can be replaced by other gases such as nitrogen.

Another advantage of the method according to the invention is obtained from an oxide layer's high affinity vis-à-vis boron which is greater than that of silicon with respect to boron. This causes volatile boron escaping into the atmosphere to be optionally absorbed by the oxide layer while the doping is being driven and allows the boron to penetrate only slightly the surface regions to be excluded from boron doping.

After cooling down, both the diffusion source layer and oxide layer are removed, for instance by a HF dip.

The semiconductor junction necessary for the solar cell is generated by phosphorus diffusion. This may take place by means of all-over diffusion, whereby in addition to the n+ doped emitter layer on the front side, a flat n+ doped layer region is produced on the back. Since a much lower temperature than when the boron is driven in is set during phosphorus diffusion at about 800 to 900° C., the p+ doping, which is much deeper at 1 to 5 $\mu$m, is retained beneath the approx. 0.2 $\mu$m deep n+ doping on the back of the solar cell.

To obtain a functional semiconductor component, the p+ doping has to be separated at the edge of the solar cell.

This avoids short circuits and resultant power losses of the solar cell. For the purpose of separating, the solar cells can be stacked on top of one another and are exposed to an etching plasma for a short time.

To obtain a functional back contact, the p+ layer has to be contacted through the n+ layer on the back. This is achieved using a back contact which contains approx. 1 to 3 percent by weight aluminum. When burning in the back contact, the aluminum penetrates the back of the solar cell and generates a p+ doping there which overcompensates the n+ doping beneath the back contact. A low-resistance connection region which ensures good current drainage during the solar cell operating mode is therefore produced beneath the back contact.

The current-draining contact that is still absent for a functional solar cell and which is located on the front side (front-side contact) can be produced in a known manner before, during or at the same time as the back contact or after burning in the back contact.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
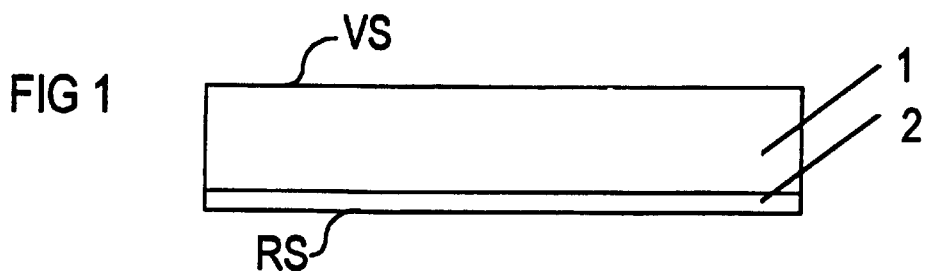
FIGS. 1 to 4 show various procedural stages based on schematic cross sections through a solar cell.

FIG. 1: a <100>orientation p-doped Cz silicon wafer is for example chosen for the solar cell. In this wafer, texturing which improves the geometry of incidence of light in order to prevent reflection (not shown in FIG. 1) can be produced on the surface by means of a brief, alkaline crystal-oriented etching.

A thin doping resist layer 2 (e.g. Siodop®, Merck company) is now spun on the back RS and dried.

Figure 2:
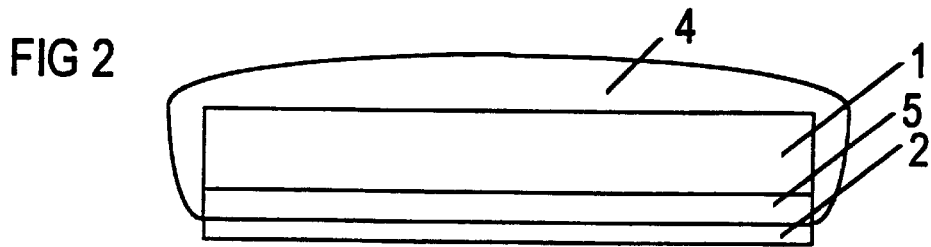

FIG. 2: the wafer prepared in this manner is now set into a tray or hurdle and placed in a furnace preheated to 1000 to 1100° C. A pure oxygen atmosphere is set inside the furnace so that an oxide layer 4 is formed directly on all those surfaces of the wafer 1 that are not covered by the boron doping resist layer 2. The boron is simultaneously driven out of the doping resist layer 2 and diffuses into the back RS of the wafer 1. A p+ doped area 5 with a depth of approx. 1 to 5 μm is formed.

An oxide layer 4 and doping resist layer 2 are removed from the wafer using a HF dip.

Figure 3:
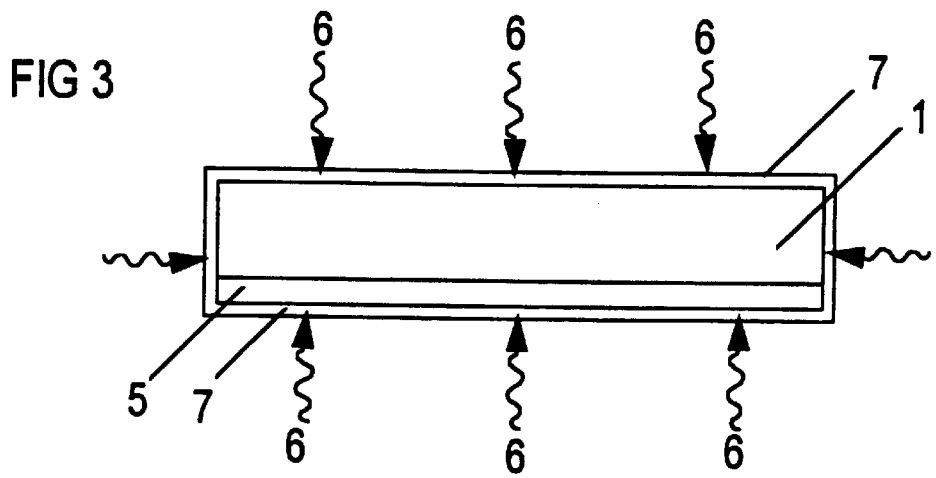

FIG. 3: a flat n+ doped surface region 7 is now produced all over as a result of phosphorus diffusion (see arrow 6). The conditions are set such that the n+ doped region 7 reaches a depth of approx. 1 μm, preferably 0.2 μm.

Figure 4:
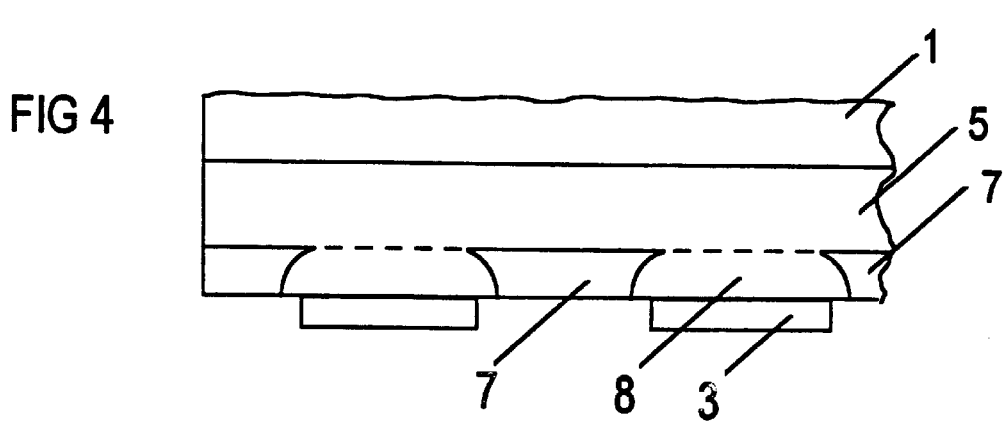

FIG. 4: after separating the n+ region 7 at the edge of the disk as a result of etching off (for example in a plasma), a back contact 3 is applied. This takes place for example by means of screen printing using a paste in which as well as binding agents and oxidic additions, conductive silver particles and 1 to 3% by weight aluminum are present. After imprinting, the back contact 3 is burnt in at approx. 700 to 800° C. The dopant aluminum additionally present in the paste is driven into the solar cell back where in the connection region 8, it ensures a p+ doping by overcompensation of the n+ doping, thereby ensuring good ohmic contact between the p+ area 5 and the back contact 3.

Figure 5:
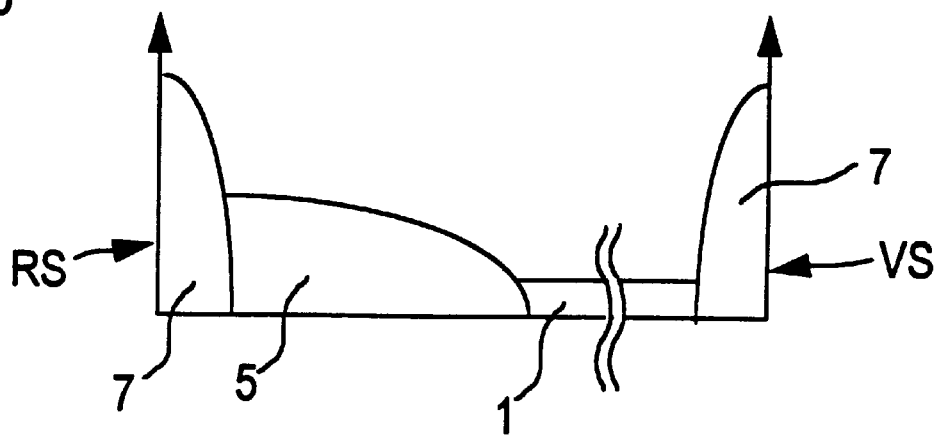
FIGS. 5 and 6 show solar-cell doping profiles generated according to the invention and FIG. 7 shows a finished solar cell in schematic cross section.

FIG. 5 schematically depicts the generated doping profile in the solar cell before the back contact is burned in. The doping concentration is applied against the disk thickness between back RS and front side VS. The region 1 represents the wafer's low even original p doping. The region 5 characterizes the p+ doping which is driven about 5 μm into the wafer's back RS. The n+ doping 7 generated by phosphorus diffusion and having a low penetration depth of about 0.2 μm forms the emitter on the front side and likewise generates an n+ doped region on the back by overcompensation of the p+ doping.

Figure 6:
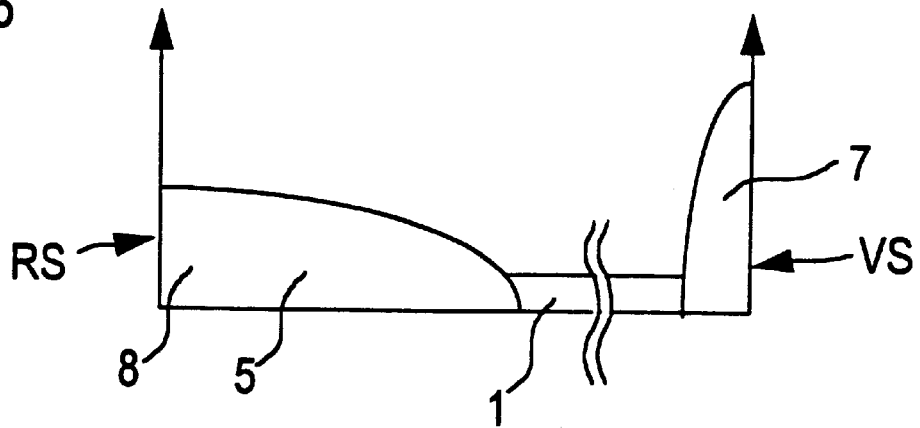

FIG. 6 depicts the doping profile after the back contact has been burned in, whereby the back contact is located in the sectional region of the depicted cross-sectional plane. The n+ doping of the back is overcompensated by the aluminum in the connection region, thus producing a continuously p+ doped region 8 beneath the back contact. A good ohmic contact between the imprinted and burned-in back contact and the solar cell is therefore ensured.

Figure 7:
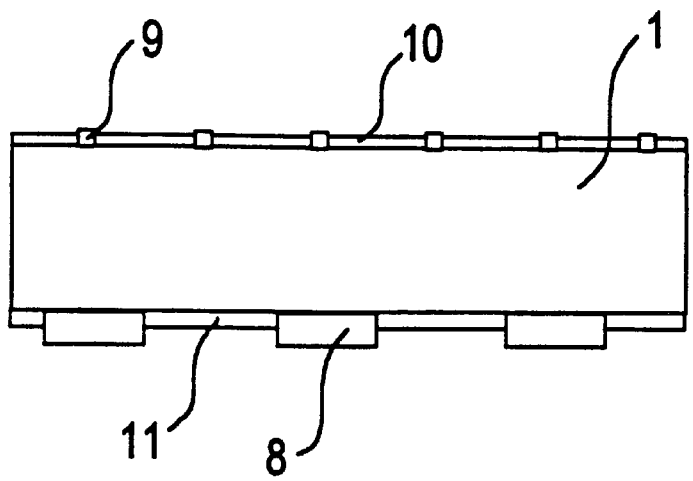

FIG. 7 shows a schematic cross section of a solar cell that is completed by means of procedural steps known per se. This cell comprises a front side contact 9 and optionally an antireflective layer 10 on the front side which can be formed from an oxide or silicon nitride, as well as a back passivating layer 11, for example a passivating oxide. These two layers can optionally be produced before applying the front and/or back contact. Due to the high surface doping, an oxide grows particularly rapidly, with the result that moderate temperatures and short process times are themselves sufficient for passivation.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A solar cell comprising:
   a p-doped solar cell body having a front side and a back side;
   a layer region p+ doped with boron and having a depth of 1 to 5 μm on said back side;
   an n+ doped layer region at least on the front side;
   a front side contact on the front side;
   a burned-in silver back contact that contains aluminum, the back contact being on the back side; and
   an aluminum-doped connection region at said back contact for contacting said layer region p+ doped with boron.

2. The solar cell according to claim 1, wherein said back contact is not holohedrally applied and wherein said layer region p+ doped with boron is overcompensated by an n+ doped layer region that has a thickness that is less than a thickness of said layer region p+ doped with boron, between regions of the back side covered by said back contact.

3. The solar cell according to claim 1, wherein the solar cell further comprises an antireflective layer on the front side and an oxide layer as a passivating layer on the back side.

* * * * *